(12) United States Patent
Yamada et al.

(10) Patent No.: US 10,233,053 B2
(45) Date of Patent: Mar. 19, 2019

(54) AUTOMATIC DOOR SWITCH INSPECTION

(71) Applicant: OTIS ELEVATOR COMPANY, Farmington, CT (US)

(72) Inventors: Atsushi Yamada, Narita (JP); Hisanori Seki, Tomisato (JP)

(73) Assignee: OTIS ELEVATOR COMPANY, Farmington, CT (US)

( * ) Notice: Subject to any disclaimer, the term of this patent is extended or adjusted under 35 U.S.C. 154(b) by 15 days.

(21) Appl. No.: 15/415,260

(22) Filed: Jan. 25, 2017

(65) Prior Publication Data

US 2018/0208432 A1 Jul. 26, 2018

(51) Int. Cl.

| B66B 5/02 | (2006.01) |
|---|---|
| B66B 13/22 | (2006.01) |
| B66B 5/00 | (2006.01) |
| G01R 19/165 | (2006.01) |
| G01R 31/327 | (2006.01) |

(52) U.S. Cl.
CPC .......... B66B 5/0025 (2013.01); B66B 5/0031 (2013.01); B66B 5/0037 (2013.01); B66B 13/22 (2013.01); G01R 19/16509 (2013.01); G01R 31/3278 (2013.01)

(58) Field of Classification Search
USPC ....................................................... 187/393
See application file for complete search history.

(56) References Cited

U.S. PATENT DOCUMENTS

| 3,961,688 A | 6/1976 | Maynard |
|---|---|---|
| 4,256,204 A | 3/1981 | Ando et al. |
| 5,175,400 A | 12/1992 | Hirabayashi et al. |
| 6,446,760 B1 | 9/2002 | Lisi |
| 6,460,658 B2 | 10/2002 | Suga et al. |
| 6,538,574 B2 * | 3/2003 | Rossignol ............. B66B 1/3492 187/399 |
| 6,591,947 B2 | 7/2003 | Horbruegger et al. |

(Continued)

FOREIGN PATENT DOCUMENTS

| CN | 2626961 Y | 7/2004 |
|---|---|---|
| CN | 2626962 Y | 7/2004 |

(Continued)

OTHER PUBLICATIONS

Elevator 1, "Why Does MyElevator Shut Down After a Power Failure?" available at: http://www.elevatorone.ca/why-does-my-elevator-shut-down-after-a-power-failure/, Oct. 12, 2012, 6pgs.

*Primary Examiner* — Christopher Uhlir
(74) *Attorney, Agent, or Firm* — Cantor Colburn LLP

(57) ABSTRACT

A door switch inspection device for detecting an abnormal condition of a landing door switch used in an elevator is disclosed. Each of a plurality of landing door switches is disposed on a corresponding landing door at each landing floor for detecting an open/closed state of the landing door. The door switch inspection device includes a plurality of voltage detection units connected to the ground side of their respective landing door switches for detecting a voltage value of their respective landing door switches, and a switch contact monitoring unit for detecting an abnormal condition of a landing door switch, which is carried out by calculating a voltage difference between two adjacent floors and comparing the voltage difference with a threshold voltage.

13 Claims, 5 Drawing Sheets

(56) References Cited

U.S. PATENT DOCUMENTS

| | | | |
|---|---|---|---|
| 6,988,594 B2 | 1/2006 | Deplazes et al. | |
| 6,998,995 B2 | 2/2006 | Nakajima | |
| 7,252,180 B2 | 8/2007 | Deplazes | |
| 7,650,970 B2 | 1/2010 | Lelic et al. | |
| 9,061,863 B2* | 6/2015 | Birrer | B66B 13/22 |
| 9,128,155 B2 | 9/2015 | Xing | |
| 10,073,140 B2* | 9/2018 | Lustenberger | B66B 5/0031 |
| 2009/0321192 A1* | 12/2009 | Kattainen | B66B 5/0056 |
| | | | 187/279 |
| 2014/0027210 A1* | 1/2014 | Rogers | B66B 5/0018 |
| | | | 187/393 |
| 2018/0086605 A1* | 3/2018 | Saarela | B66B 13/24 |

FOREIGN PATENT DOCUMENTS

| | | |
|---|---|---|
| CN | 1558863 A | 12/2004 |
| CN | 203229283 U | 10/2013 |
| EP | 1427660 B1 | 3/2006 |

* cited by examiner

AUTOMATIC DOOR SWITCH INSPECTION

TECHNICAL FIELD

The present invention relates generally to an elevator system. In particular, the present invention relates to a detection of an abnormal condition of a door switch used in an elevator.

BACKGROUND ART

In general, an elevator system includes a plurality of door interlocks installed on landing doors at their respective landing floors. These door interlocks are configured to be released by mechanically interlocking with an elevator car door when the elevator car door is open on arrival of the elevator car at their respective landing floors. With such a configuration, not only can landing doors at the landing floors be prevented from being opened improperly from the outside, but the operation of the elevator car can be interrupted appropriately even if a landing door was opened, thereby unforeseen accidents can be avoided in advance.

Such a door interlock is usually provided with a landing door switch for detecting a locked state and an unlocked state of the door interlock, and a switch contact of the landing door switch is opened and closed in conjunction with the opening and closing of the door interlock. Each landing door switch is connected in series with each other and with a relay coil of a door close detection relay. The door close detection relay is configured such that a relay contact of the door close detection relay is closed only when all the landing door switches are closed, followed by sending a signal indicative of the closed state of all the door switches to the elevator control device to properly operate the elevator car.

On the other hand, in such a landing door switch, it is known that a poor contact may occur due to dust adhesions to a switch contact, contact corrosions, aged deteriorations, etc. In a case when a periodical inspection is performed, a maintenance person has to inspect all the door interlocks manually (and the landing door switches as well). In particular, when the elevator system is installed in a high-rise building, the number of door interlocks to be checked increases and it takes more time for inspection, and thus there is a disadvantage of increasing a burden on the maintenance person.

Furthermore, even if there is a poor contact in only one of the landing door switches, it is not only necessary to examine all of the door interlocks (and the landing door switches accordingly), but is necessary to identify whether a specific door interlock itself is in an abnormal condition or a lading door switch has a contact failure. In such a case, it requires much more time to recover the entire elevator system.

Therefore, there exists in the art a need for providing a door switch inspection device, capable of not only detecting abnormal conditions in a landing door switch, but also identifying on which landing door switch a poor electrical contact occurs in advance of failure.

SUMMARY OF INVENTION

According to one aspect of the present invention, a door switch inspection device for detecting an abnormal condition of a landing door switch used in an elevator is disclosed. Each of a plurality of landing door switches is disposed on a corresponding landing door at each landing floor for detecting an open and a closed state of the landing door. Each of the plurality of landing door switches is connected in series with each other and with a relay coil of a door switch relay between power supply and ground. The door switch inspection device includes a plurality of voltage detection units connected to the ground side of their respective landing door switches for detecting a voltage value of their respective landing door switches in the closed state of all the landing door switches, and a switch contact monitoring unit connected to the plurality of voltage detection units for detecting an abnormal condition of a landing door switch.

The switch contact monitoring unit according to the present invention is configured to calculate a voltage difference between two voltage values obtained from a landing floor and an adjacent upper floor with respect to all floors, compare the voltage difference with a threshold voltage, and detect the abnormal condition of the landing door switch at the landing floor if the voltage difference exceeds the threshold voltage.

In some embodiments, the abnormal condition of the landing door switch at the highest floor is determined by calculating a voltage difference between the voltage value obtained from the highest floor and the power supply voltage and comparing the voltage difference with the threshold value.

In some embodiments, each of the plurality of voltage detection units is included in a hall station disposed at each landing floor.

In some embodiments, the switch contact monitoring unit is included in a main controller for an elevator system.

In some embodiments, the threshold voltage is predetermined based on the number of floors in a building, the power supply voltage to be applied and the resistance value of the door switch relay.

In some embodiments, the voltage value is an analog input voltage detected by the voltage detection unit.

In some embodiments, the switch contact monitoring unit transmits an alert to inspect the switch contact of the landing door switch at the landing floor if the voltage difference exceeds the threshold voltage.

According to another aspect of the present invention, a method of detecting an abnormal condition of a landing door switch for an elevator is disclosed. Each of a plurality of landing door switches is disposed on a corresponding landing door at each landing floor for detecting an open and a closed state of the landing door. Each of the plurality of landing door switches are connected in series with each other and with a relay coil of a door switch relay between power supply and ground. The method of detecting an abnormal condition of a landing door switch for an elevator includes obtaining a voltage value of each landing door switch with respect to all floors in the closed state of all the landing door switches, calculating a voltage difference between two voltage values obtained from a landing floor and an adjacent upper floor with respect to all floors, comparing the voltage difference with a threshold voltage, and detecting the abnormal condition of the landing door switch at the landing floor if the voltage difference exceeds the threshold voltage.

In some embodiments, obtaining the voltage value further comprises obtaining the voltage value from the ground side of each landing door switch.

In some embodiments, calculating the voltage difference further comprises calculating a voltage difference between the voltage value obtained from the highest floor and the power supply voltage.

In some embodiments, the threshold voltage is predetermined based on the number of floors in a building, the power supply voltage to be applied and the resistance value of the door switch relay.

In some embodiments, the voltage value is an analog input voltage.

In some embodiments, the method further includes transmitting an alert to inspect the switch contact of the landing door switch at the landing floor if the voltage difference exceeds the threshold voltage.

These and other aspects of this disclosure will become more readily apparent from the following description and the accompanying drawings, which can be briefly described as follows.

DESCRIPTION OF EMBODIMENTS

Figure 1:
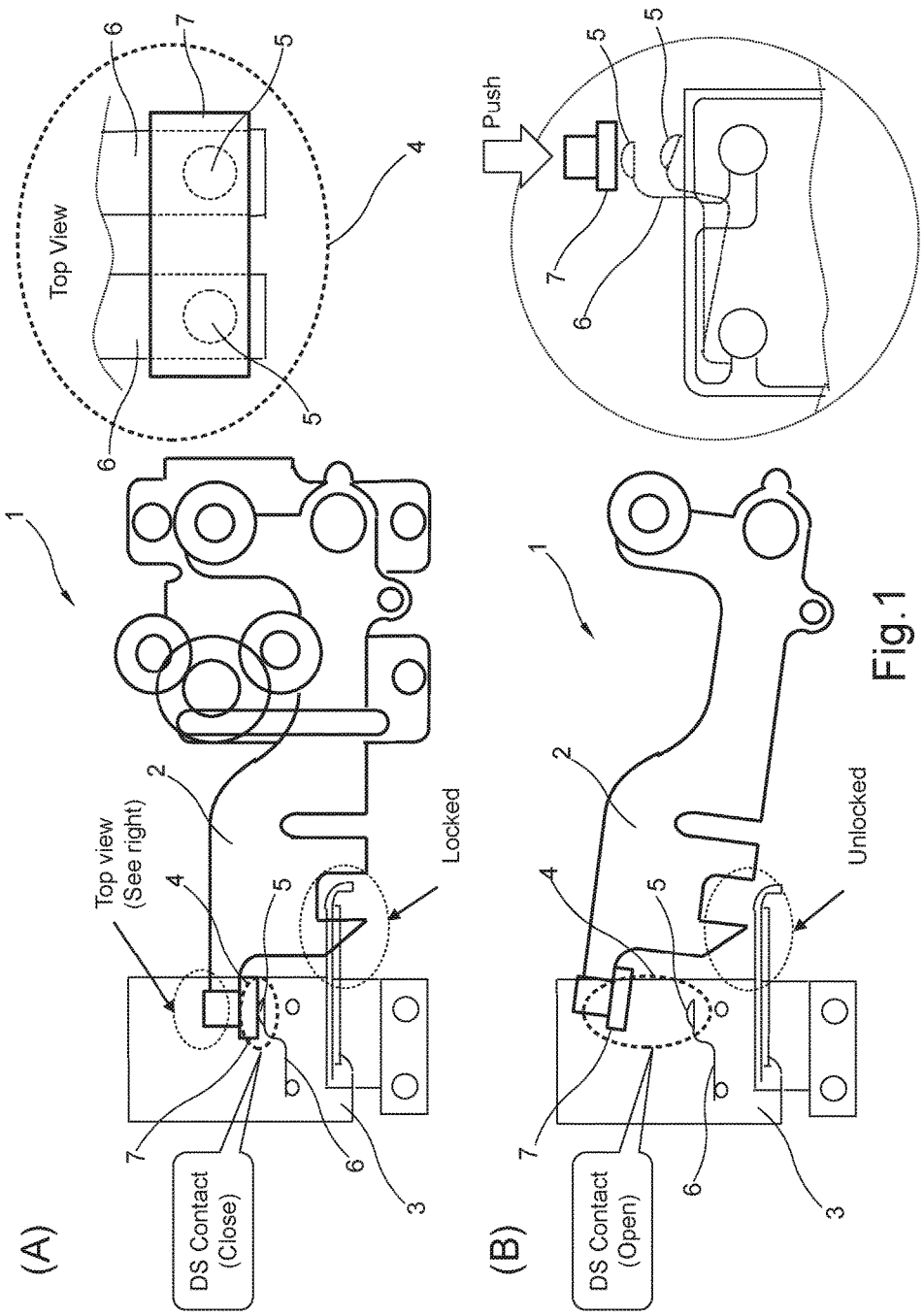
FIG. 1 is a schematic view showing one possible arrangement of a door interlock according to the present invention installed on a landing door at each landing floor.

FIG. 1 shows an example of a door interlock 1 in accordance with the present invention installed on a landing door at each landing floor. In one example, each door interlock 1 includes a latch member 2 which is pivotably mounted on the upper portion of one side of a set of double-doors (not shown), and a receiver 3 mounted on the other side of the double-doors in proximity to the latch member 2 for receiving the corresponding latch member 2 when it is latched. As shown in FIG. 1(A), the latch member 2 engages the receiver 3 when the door is closed, thereby preventing the landing door from being opened intentionally from the outside in such a case when the elevator car is not at the landing.

On the other hand, as shown in FIG. 1(B), when the elevator car arrives at the landing and the car door opens, the latch member 2 disengages from the receiver 3 by mechanically interlocking with the car door (not shown), and thereby the door interlock 1 is released.

Furthermore, each door interlock 1 is equipped with a corresponding landing door switch 4. As an example, the landing door switch 4 includes two switch contacts 5, 5 each having a spring contact 6 mounted on a leaf spring, and a bridging contact 7 configured to electrically connect or "bridge" two switch contacts 5, 5 when it is biased against the switch contacts 5, 5. As shown in FIG. 1, two switch contacts 5, 5 are mounted, for example, on the receiver 3, and the bridging contact 7 is mounted on the latch member 2 so as to bridge two switch contacts 5, 5 when the latch member 2 is latched upon elevator door closing. In particular, the landing door switch 4 is configured such that when the elevator door is closed (FIG. 1A), two switch contacts 5, 5 are electrically connected to each other via the bridging contact 7 to be set in ON, and when the door is open (FIG. 1B), two switch contacts 5, 5 are released from the bridging contact 7 in response to the disengagement of the latch member 2 to be set in OFF.

The landing door switches 4 disposed on landing doors at their respective landing floors are, as described later, connected in series with each other with respect to a door close detection relay 8 that is electrically connected to a main controller 9. The main controller 9 is configured to operate the elevator car only when the main controller 9 detects that all the landing door switches 4 are closed with respect to the door close detection relay 8 (i.e. when all the lading door switches are ON).

It should be understood that the structure of the present invention is not limited to the door interlock as described above with reference to FIG. 1, but the present invention may include any door interlock capable of implementing the door switch monitoring device described herein. It should also be understood that the landing door switch is not limited to a spring contact as described above, but may include any known types of landing door switches.

Figure 2:
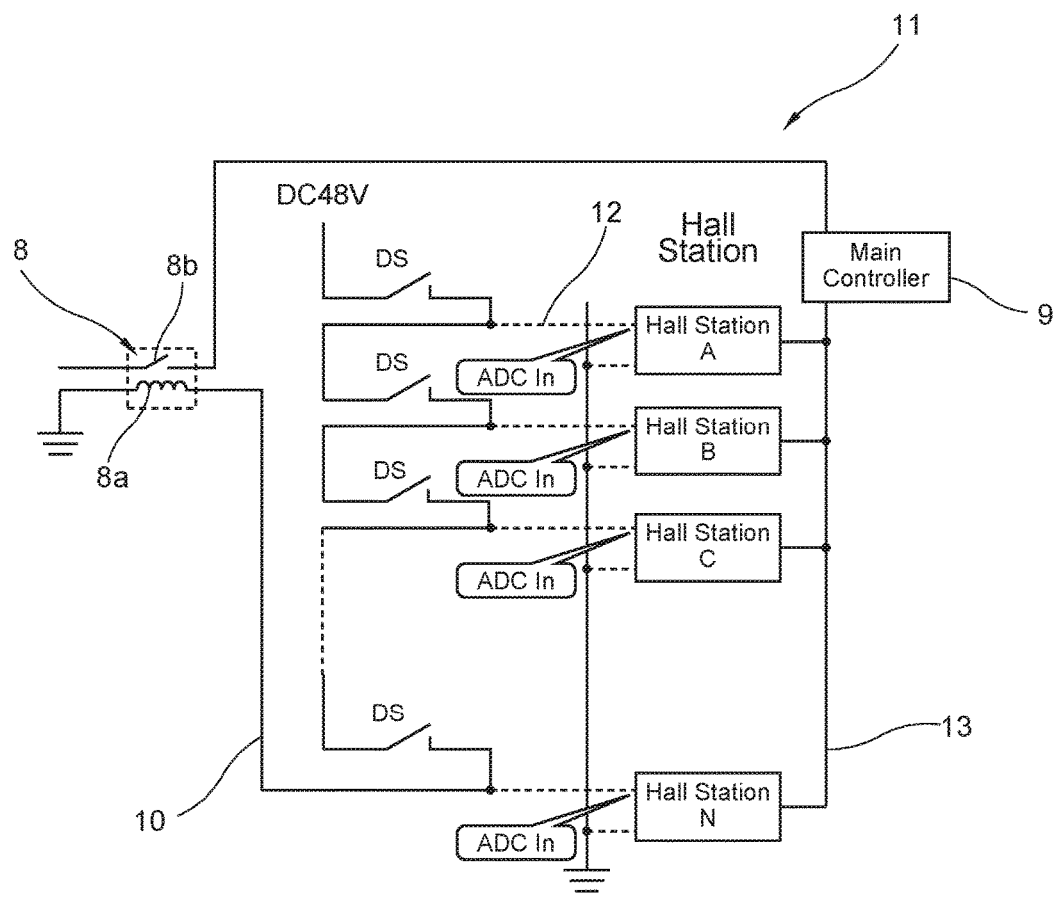
FIG. 2 is a voltage monitoring wiring diagram of landing door switches installed on landing doors at their respective landing floors in accordance with the present invention, for detecting an abnormal condition of a landing door switch.

FIG. 2 illustrates a voltage monitoring wiring diagram of the landing door switches 4 installed on landing doors at their respective landing floors in accordance with the present invention, for detecting an abnormal condition between the switch contacts 5, 5 and the bridging contact 7. As shown in FIG. 2, the landing door switches (DS) 4 disposed on landing doors at their respective landing floors are connected in series with each other between power supply (e.g. DC 48V) and ground, and a door close detection relay 8 is provided between the door switch 4 at the lowest landing floor and ground. The door close detection relay 8 has a relay coil 8a and a relay contact 8b, and each landing door switch 4 is connected in series with each other with respect to the relay coil 8a of the door close detection relay 8.

Here, the relay contact 8b of the door close detection relay 8 is electrically connected to a main controller 9 and is set to be closed in response to a closed state detection of all the landing door switches 4. Subsequently, the relay contact 8b sends a signal indicative of the closed state detection signal of all the landing door switches 4 to the main controller 9 to operate the elevator car. On the other hand, when the elevator car stops at a landing floor and the corresponding landing door switch 4 is opened, the relay contact 8b of the door close detection relay 8 is opened accordingly, and the main controller 9 stops operation of the elevator car until it receives closed state detection of all the landing door switches 4 from the door close detection relay 8.

Next, a landing door switch voltage monitoring wiring 11 connected to the landing door switches 4 is described.

Hall stations A, B, C, . . . , N are connected to their respective door switches (DS in FIG. 2) at their respective landing floors. As shown in FIG. 2, an analog voltage input line 12 drawn from ground side of each door switch 4 is connected to a corresponding hall station A, B, C, . . . , N. The hall stations A, B, C, . . . , N are connected to the main controller 9 via control lines 13. Each hall station A, B, C, . . . , N is configured to obtain voltage value (analog input voltage) at a corresponding switch contact of each landing door switch arranged on each landing floor, and transmit the voltage value to the main controller 9 in response to a request.

Here, the main controller 9 is generally provided with a control circuit for dispatching elevator cars, group management control, elevator safety control, etc., and also provided with a door switch contact monitoring circuit for carrying out an abnormal condition detection algorithm according to the present invention which detects a contact failure of a landing door switch as described below.

The hall stations A, B, C, ..., N provided on their respective landing floors generally have their respective hall call buttons and are configured to transmit a hall call to the main controller 9, in addition to the detection of voltage values at their respective switch contacts of the landing door switches 4 in accordance with the present invention.

Figure 3:
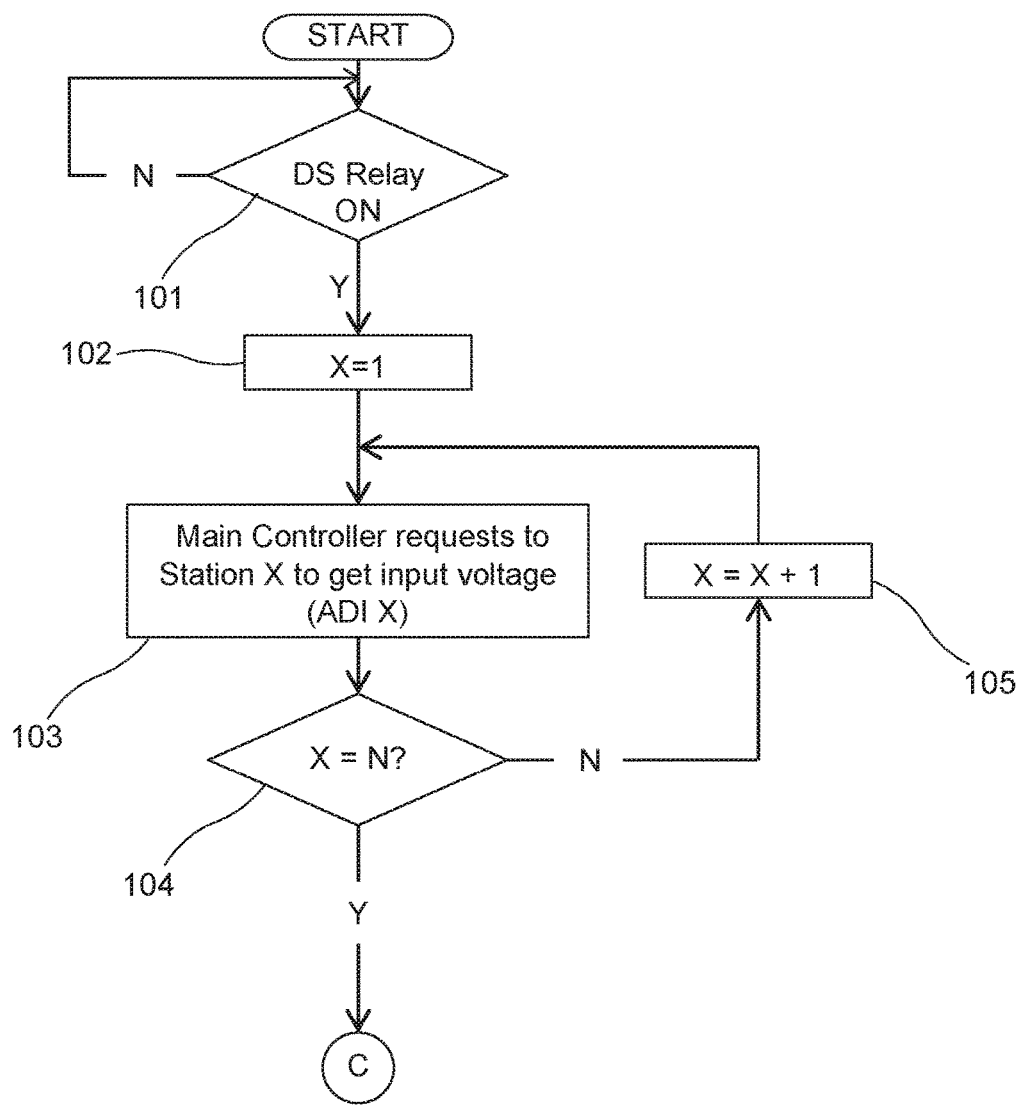
FIG. 3 is a flow diagram of detecting a voltage value at each switch contact of a corresponding landing door switch disposed at each landing floor.

FIG. 3 illustrates a flow diagram 100 of detecting a voltage value (analog input voltage) at each switch contact of a corresponding landing door switch 4 disposed at each landing floor. In this algorithm, operation starts from checking the status of door close detection relay 8 as shown in FIG. 2. At step 101, once the door close detection relay 8 detects that all the landing door switches 4 are closed (i.e. all the door switches 4 are ON), the closed state detection signal of all the landing door switches 4 is sent to the main controller 9 to initiate detection of voltage value at each switch contact of a corresponding landing door switch 4, followed by setting the count value "X" to one (X=1) (step 102) and then proceeds to step 103. It should be noted that "X" does not denote a floor number in a building, but it corresponds to the number of the hall stations as well as the landing door switches. For example, if this algorithm is carried out to a building with eight stories above and two below, the total number of the hall stations (i.e. the total number of the landing door switches) in the building, N, is ten, and each value, "X=1, 2, ..., N", corresponds to the landing door switch at the eighth floor, seventh floor, ..., and the basement second floor, respectively. In other words, "X=1, 2, ..., N" correspond respectively to the hall stations A, B, C, ..., N disposed from the highest floor to the lowest floor.

At step 103, the main controller 9 sends a request to a hall station X to obtain an input voltage (ADI X) of a landing door switch 4. The input voltage value (ADI X) derived from this algorithm 100 is stored in a memory (not shown) and then proceeds to step 104.

Subsequently, the main controller 9 checks to see if the count value "X" reaches to "N" (step 104). If the count value "X" does not reach to "N", i.e., if the main controller does not obtain input voltage values from all the hall stations A, B, ..., N, then the algorithm increments the count "X" by one (step 105) and returns to step 103 to repeat process. This loop continues until all the input voltage values of the landing door switches 4 are obtained.

Figure 4:
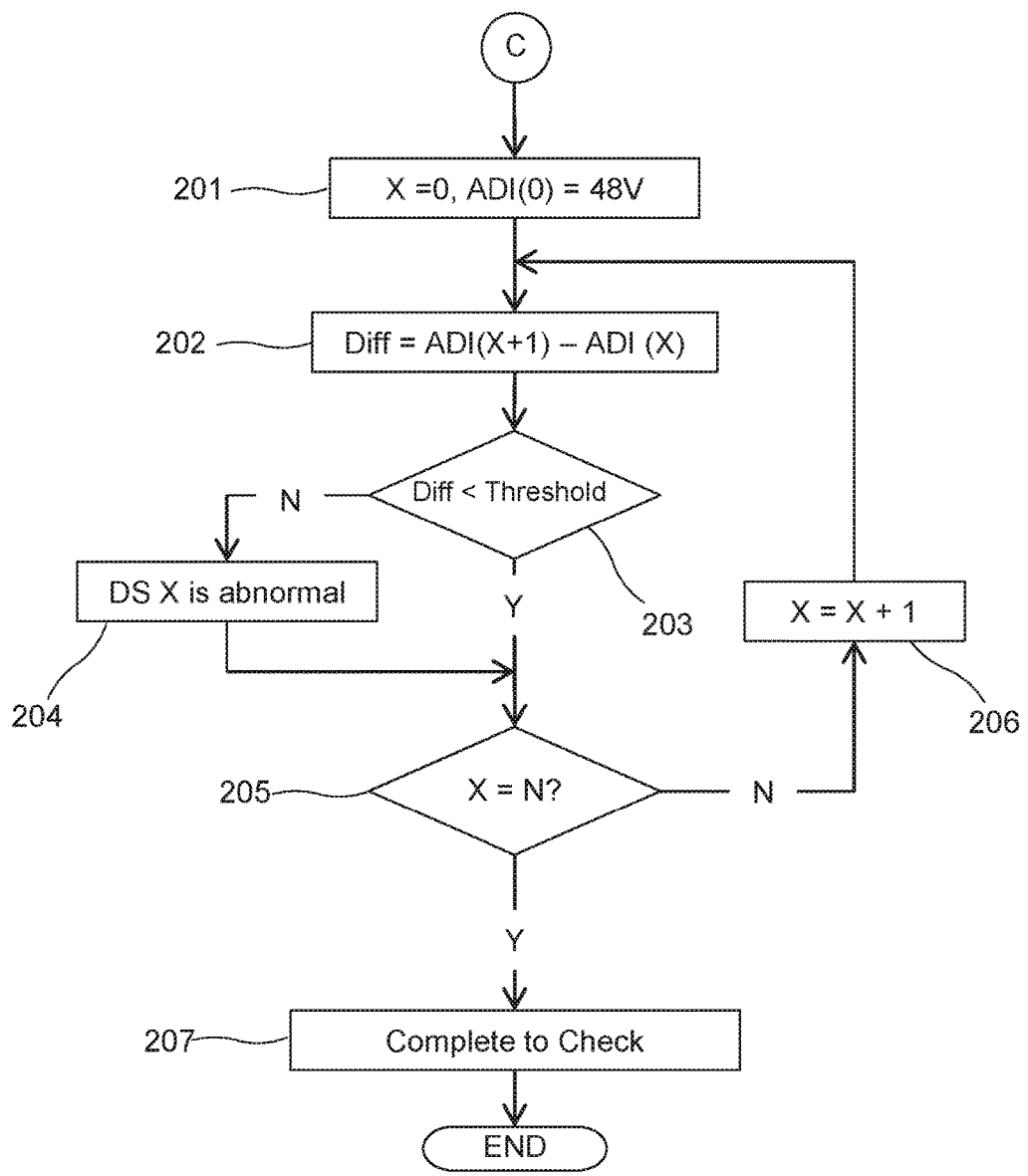
FIG. 4 is a flow diagram of determining an abnormal condition at a contact point of a landing door switch.

When the count value "X" reaches to "N" (step 104), the main controller 9 then proceeds to the algorithm in FIG. 4 which determines an abnormal condition at a contact point of a landing door switch 4.

FIG. 4 illustrates a flow diagram 200 of the detection algorithm of an abnormal condition at a contact point of a landing door switch 4. At step 201, operation starts from setting the count value "X" to zero (0) and the power supply voltage, ADI(0) (e.g. setting to DC 48V), and proceeds to step 202. At step 202, the voltage difference between the voltage value obtained from the top floor and the power supply voltage is calculated (Diff=ADI(1)−ADI(0)). Note that voltage (ADI(X)) at step 202 refers to a voltage value of a corresponding landing door switch 4 detected by the hall station X. Each voltage value is obtained from the algorithm 100 shown in FIG. 3, where X=1, 2, ..., N correspond respectively to the hall stations A, B, C, ..., N disposed from the highest floor to the lowest floor.

At step 203, the voltage difference between the voltage value from the top floor and the power supply voltage derived at step 202 is compared with a threshold value. The threshold value is a predetermined voltage value which may be set by taking into consideration the number of the floors in a building, the power supply voltage to be applied, resistance values of relays, etc. If the voltage difference is less than the threshold value, then the status of the switch contact of the door switch 4 at the highest floor which is detected by the hall station A, is determined to be in a normal condition, and then proceeds to step 205. If the voltage difference exceeds the threshold value, then the main controller 9 determines that an abnormal condition occurs at the switch contact of the door switch 4 at the highest floor (step 204), and the main controller 9 may additionally transmit a warning to a maintenance person to inspect the switch contact of the door switch 4 at the highest floor, followed by proceeding to step 205. It should be understood that the warning signal may be transmitted to a maintenance person or a building administrative company via any means known in the prior art, including, but not limited to, internet, fixed lines, etc.

At step 205, the main controller checks to see if the count value "X" reaches to "N". If the count value "X" does not reach to "N", then the algorithm increments the count "X" by one (step 206) and returns to step 202 to repeat process. Then, the voltage difference between two voltage values obtained from an upper floor and an adjacent lower floor (Diff=ADI(X+1)−ADI(X)) is obtained and compared with the threshold voltage value, subsequently. This loop continues until the voltage difference between two voltage values obtained from an upper floor and an adjacent lower floor is determined with respect to all floors, to see whether an abnormal condition occurs at any switch contact of a door switch 4 at any floor. By comparing the voltage difference with the threshold voltage value, an abnormal voltage drop across any door switch 4 can be easily detected. This voltage drop is generally caused by an increase in resistance observed at the switch contact of a door switch 4, which can be generated by the adhesion of the dust, corrosions, aged deteriorations or the like. Following the execution of step 207, the algorithm 200 completes and returns to step 101 (FIG. 3) to repeat process.

Figure 5:
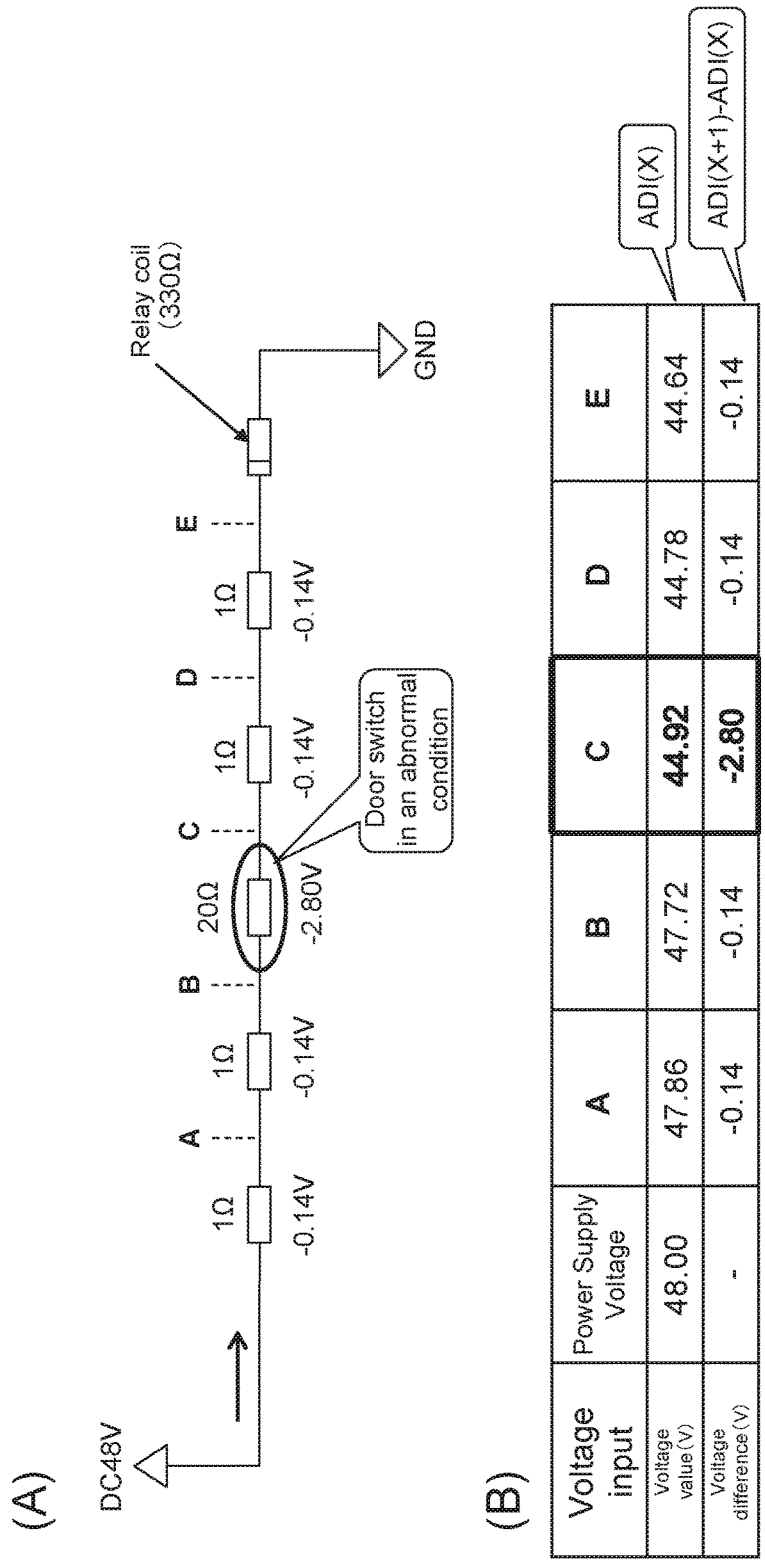
FIG. 5 illustrates an example method of detecting a landing door switch having an abnormal condition using a detection algorithm of the present invention.

Next, with reference to FIG. 5, a method of detecting a landing door switch 4 having an abnormality will be described using a detection mechanism of the present invention shown in FIG. 1 to FIG. 4.

Assume that the detection mechanism in accordance with the present invention is installed in a building with five stories above, and an abnormal condition has occurred in a landing door switch 4 at the third floor. In this case, assume that the resistance value at the door switch contact is usually 1 ohm (Ω) and the resistance value at the door switch contact having abnormal condition (at the third floor) is 20 ohms. The threshold value of the voltage difference is set to 2.0V. The power supply voltage is DC 48V and the resistance value of the relay coil is 330 ohms. Although the hall stations A-E are connected via the analog voltage input lines A-E for monitoring a voltage difference, these current values are assumed to be infinitely close to zero since the impedance of these input lines is high. That is, the current values of the voltage input lines A-E can be neglected.

As described with reference to FIG. 3, the analog input voltages at their respective switch contacts of the landing door switches 4 are obtained by the hall stations A, B, C, D and E in response to a request from the main controller 9, and these voltage values are shown in the first row of the table shown in FIG. 5(B). After obtaining the voltage values of the landing door switches 4 at all floors, the voltage difference between two voltage values obtained from an upper floor and an adjacent lower floor is calculated subsequently by executing the algorithm shown in FIG. 4. These results are shown in the second row of the table in FIG. 5(B).

As can be appreciated from FIG. 5(B), a voltage difference (2.80 V) exceeding the threshold voltage difference of 2.0 V is observed at the voltage input C. That is, since the voltage difference, Diff=ADI (3)–ADI (2) (step 202 as shown in FIG. 4), exceeds the threshold value, it is found that there is an abnormality occurred at the switch contact of the third door switch 4 (at the third floor). This voltage drop is generally caused by an increase in resistance observed at the switch contact of the third door switch 4 arranged between the voltage input lines B and C, which can be generated by the adhesion of the dust, corrosions, aged deteriorations or the like.

The present invention is characterized in that an abnormal condition across a switch contact of a landing door switch is detected by comparing a voltage drop value across the switch contact of the landing door switch (i.e., a difference between two voltage values detected at the landing floor and at an adjacent upper floor) and a predetermined threshold voltage.

According to the present invention, by employing an automatic door switch inspection system using a simple control algorithm as described with reference to FIGS. 3 and 4, it is capable of detecting which landing door switch has an abnormal condition associated with dust adhesions to switch contacts, corrosions of contacts, aged deteriorations, etc., thereby remarkably reducing a burden on a maintenance person when a periodical inspection is performed.

In particular, since the door switch inspection device in accordance with the present invention has an algorithm implementable on an existing main controller and hall stations, it can also be easily retrofitted to existing elevator system.

While the present invention has been particularly shown and described with reference to the exemplary embodiments as illustrated in the drawings, it will be recognized by those skilled in the art that various modifications may be made without departing from the spirit and scope of the invention as disclosed in the accompanying claims.

The invention claimed is:

1. A door switch inspection device for detecting an abnormal condition of a landing door switch used in an elevator, each of a plurality of landing door switches disposed on a corresponding landing door at each of a plurality of landing floors for detecting an open and a closed state of the corresponding landing door, each of the plurality of landing door switches connected in series with each other and with a relay coil of a door switch relay between a power supply and ground, the door switch inspection device comprising:
a plurality of voltage detection units connected to the ground side of respective landing door switches for detecting a voltage value of their respective landing door switches in the closed state of all the landing door switches; and
a switch contact monitoring unit connected to the plurality of voltage detection units for detecting an abnormal condition of a landing door switch,
the switch contact monitoring unit configured to calculate a voltage difference between two voltage values obtained from a landing floor and an adjacent upper floor with respect to all floors, compare the voltage difference with a threshold voltage, and detect the abnormal condition of the landing door switch at the landing floor when the voltage difference exceeds the threshold voltage.

2. The door switch inspection device of claim 1, wherein the abnormal condition of the landing door switch at a highest floor is determined by calculating a voltage difference between the voltage value obtained from the highest floor and a power supply voltage and comparing the voltage difference with the threshold value.

3. The door switch inspection device of claim 1, wherein each of the plurality of voltage detection units is included in a hall station disposed at each landing floor.

4. The door switch inspection device of claim 1, wherein the switch contact monitoring unit is included in a main controller for an elevator system.

5. The door switch inspection device of claim 1, wherein the threshold voltage is predetermined based on a number of floors in a building, a power supply voltage to be applied and a resistance value of the door switch relay.

6. The door switch inspection device of claim 1, wherein the voltage value is an analog input voltage detected by the voltage detection units.

7. The door switch inspection device of claim 1, wherein the switch contact monitoring unit transmits an alert to inspect a switch contact of the landing door switch at the landing floor when the voltage difference exceeds the threshold voltage.

8. A method of detecting an abnormal condition of a landing door switch for an elevator, each of a plurality of landing door switches disposed on a corresponding landing door at each of a plurality of landing floors for detecting an open and a closed state of the corresponding landing door, each of the plurality of landing door switches connected in series with each other and with a relay coil of a door switch relay between a power supply and ground, the method comprising:
obtaining a voltage value of each landing door switch with respect to all floors in the closed state of all the landing door switches;
calculating a voltage difference between two voltage values obtained from a landing floor and an adjacent upper floor with respect to all floors;
comparing the voltage difference with a threshold voltage; and
detecting the abnormal condition of the landing door switch at the landing floor when the voltage difference exceeds the threshold voltage.

9. The method of claim 8, wherein obtaining the voltage value further comprises obtaining the voltage value from the ground side of each landing door switch.

10. The method of claim 8, wherein calculating the voltage difference further comprises calculating a voltage difference between the voltage value obtained from a highest floor and a power supply voltage.

11. The method of claim 8, wherein the threshold voltage is predetermined based on a number of floors in a building, a power supply voltage to be applied and a resistance value of the door switch relay.

12. The method of claim 8, wherein the voltage value is an analog input voltage.

13. The method of claim 8, further comprising transmitting an alert to inspect a switch contact of the landing door switch at the landing floor when the voltage difference exceeds the threshold voltage.

* * * * *